(12) United States Patent
Inoue et al.

(10) Patent No.: US 6,580,633 B2
(45) Date of Patent: Jun. 17, 2003

(54) NONVOLATILE SEMICONDUCTOR MEMORY DEVICE

(75) Inventors: Satoshi Inoue, Suwa (JP); Ichio Yudasaka, Suwa (JP); Piero Migliorato, Cambridge (GB)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/965,686

(22) Filed: Sep. 27, 2001

(65) Prior Publication Data

US 2002/0054522 A1 May 9, 2002

(51) Int. Cl.[7] .............................................. G11C 11/22
(52) U.S. Cl. ....................................... 365/145; 365/147
(58) Field of Search ................................. 365/145, 147

(56) References Cited

U.S. PATENT DOCUMENTS 5,523,964 A * 6/1996 McMillan et al. .......... 365/145
6,370,056 B1 * 4/2002 Chen et al. ................. 365/145

* cited by examiner

Primary Examiner—M. Tran
(74) Attorney, Agent, or Firm—Harness, Dickey & Pierce, P.L.C.

(57) ABSTRACT

A semiconductor memory device comprising: an active layer in which are formed a transistor source, channel and drain; a gate for the transistor; a layer of ferroelectric material; and an electrode for applying a voltage to the ferroelectric material; the electrode being spaced apart from the gate, the layer of ferroelectric material having two stable states of internal polarization, and the arrangement being such that the two states of polarization have a detectable difference in effect upon the transfer characteristic of the transistor. The arrangement enables cross-talk between memory cells upon write to be avoided and can mitigate physical interface problems between the ferroelectric material and the active layer.

14 Claims, 14 Drawing Sheets

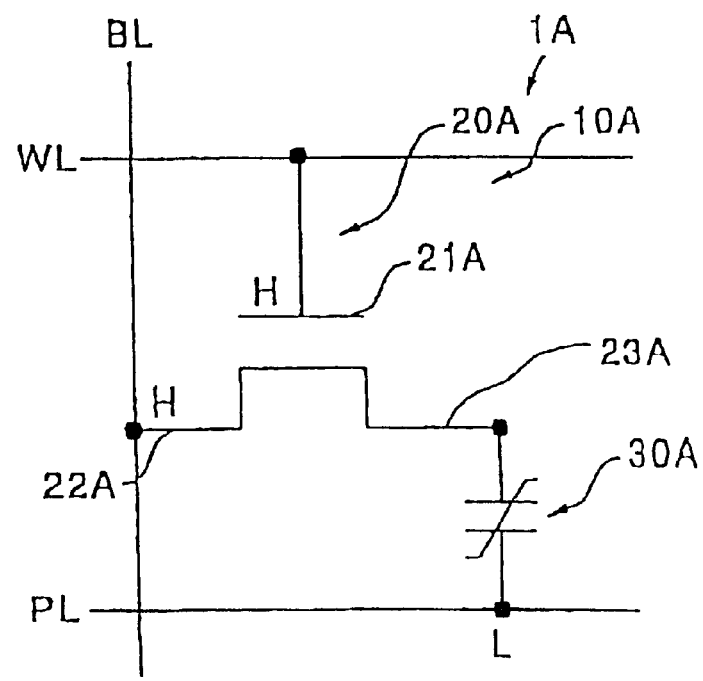
Fig. 10A     *Prior Art*
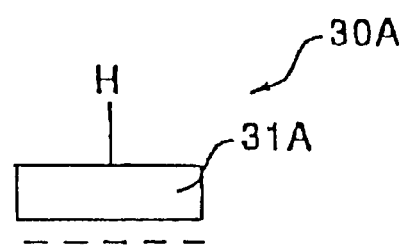
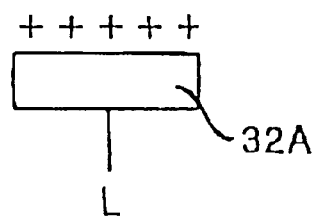
Fig. 10B     PZT
*Prior Art*

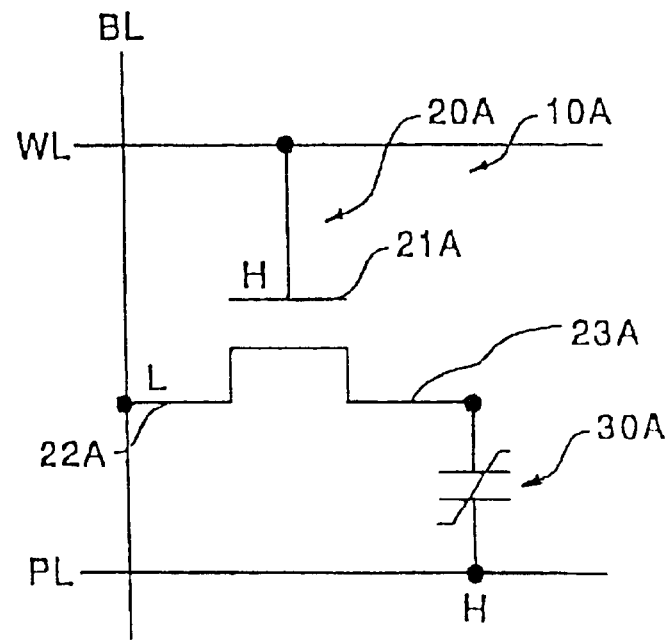
Fig. 11A  Prior Art
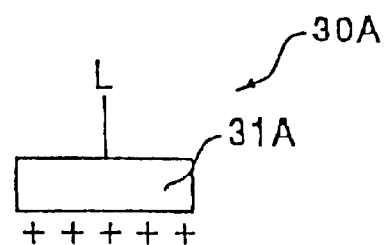
Fig. 11B  PZT
Prior Art
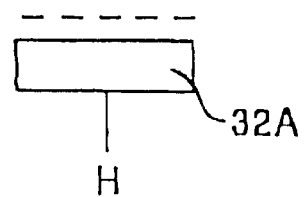

NONVOLATILE SEMICONDUCTOR MEMORY DEVICE

BACKGROUND OF THE INVENTION

1. Technical Field

The present invention generally relates to a semiconductor memory device and, more particularly, to a non-volatile semiconductor memory device.

2. Background Art

Among various kinds of semiconductor memory devices, a FeRAM (a ferroelectric memory) has memory cells, in each of which a gate electrode 21A and a source region 22A of, for example, an N-channel type MIS transistor are electrically connected to a word line WL and a bit line BL, respectively, and a ferroelectric capacitor 30A is electrically connected between a drain region 23A and a plate line PL of this MIS transistor, as is seen from FIG. 10(A) showing an equivalent circuit thereof.

In the case of such a kind of a semiconductor memory device 1A, when one of binary data "1" and "0", for instance, data "1" is written to a memory cell 10A, the word line WL is set at a high level (H) in a state in which the bit line BL is maintained at the high level (H), while the plate line PL is maintained at a low level (L). Consequently, the MIS transistor 10A is put into an on-state. Thus, in the ferroelectric capacitor 30A, an electrode 31A electrically connected to the drain region 23A of the MIS transistor 10A is set at the high level (H), while an electrode 32A electrically connected to the plate line PL thereof is set at the low level (L), as illustrated in FIG. 10(B). This results in occurrence of polarization in a ferroelectric layer of the ferroelectric capacitor 30A.

In contrast with this, when data "0" is written to the memory cell 10A (that is, when deleting data written thereto), the word line WL is set at the high level (H) in a state in which the bit line BL is maintained at the low level (L) and the plate line PL is set at the high level (H), as illustrated in FIG. 11(A). Consequently, the MIS transistor 10A is brought into an on-state. In the ferroelectric capacitor 30A, an electrode 31A electrically connected to the drain region 23A of the MIS transistor 10A is set at the low level (L), while an electrode 32A electrically connected to the plate line PL is set at the high level (H), as illustrated in FIG. 11(B). Thus, the ferroelectric layer of the ferroelectric capacitor 30A is polarized in a direction opposite to the direction of polarization in the case of writing the data "1" thereto.

Next, an operation of reading information is described hereinbelow. First, the bit line BL is precharged at ground potential. Thereafter, the bit line BL is put in a high impedance state. Subsequently, the electric potential of the plate line PL is fixed at ground potential. At that time, the ferroelectric capacitor 30A is maintained in the polarized state as before. Then, the plate line PL is set at the high level (H). At that time, charges are discharged from the ferroelectric capacitor 30A. The amount of the discharged charge varies with a direction in which the polarization is previously caused. Moreover, the discharged electric charge appears as a voltage of the bit line BL. Thus, it is determined by amplifying this voltage by means of a sense amplifier which of "1" and "0" the data represents.

However, in the case of the conventional FeRAM, when information is read, the ferroelectric capacitor 30A discharges. Thus, it is necessary for holding the data to write the data thereto again. That is, in the case of the conventional FeRAM, a destructive read operation is performed. Meanwhile, generally, in the case of FeRAMs, the number of times of writing data is limited. Therefore, in the case of the destructive read operation, the writing of data is needed every time information is read. Consequently, the scope of applications of the conventional FeRAM is extremely limited.

Thus, problems to be solved by the present invention reside in constituting a memory cell from one transistor and one capacitor and in providing a non-volatile semiconductor memory device that can read data nondestructively.

SUMMARY OF THE INVENTION

To solve the foregoing problems, according to a first aspect of the present invention, there is provided a semiconductor memory device, which first, comprises at least a plurality of memory cells each formed by stacking a plate electrode, a ferroelectric layer, an insulating film, a channel region of a MIS (Metal Insulator Semiconductor) transistor, a gate insulating film of the MIS, and a gate electrode of the MIS transistor in this order. A word line is electrically connected to the gate electrode of each of the plurality of memory cells. First and second bit lines are electrically connected to a source region and a drain region of the MIS transistor, respectively. A plate line is electrically connected to the plate electrode.

In the specification of the present application, the term "MIS" is strictly for the purpose of representing a structure and does not mean that the gate electrode is limited to a metallic one. The term "MIS" implies that, for example, a doped silicon film may be used as the gate electrode.

According to the first aspect of the present invention, the MIS transistor is, for instance, a thin film transistor.

In the semiconductor memory device of the present invention, when data is stored in the memory cell, a voltage of a polarity corresponding to the data is applied between the plate line and each of the first and second bit lines. Moreover, a gate voltage for turning on the MIS transistor is applied to the gate electrode from the word line.

For example, when one kind of binary data is stored in the memory cell, a voltage of a polarity corresponding to the one kind of binary data is applied between the plate line and each of the first and second bit lines. Moreover, a gate voltage for turning on the MIS transistor is applied to the gate electrode from the word line. In contrast, when the other kind of binary data is stored in the memory cell, a voltage of a polarity opposite to the polarity of the voltage applied in the case of storing the one kind of data is applied between the plate line and each of the first and second bit lines. Moreover, a gate voltage for turning on the MIS transistor is applied to the gate electrode from the word line.

When data is written thereto in this manner, electric charges corresponding to the polarity of the voltage applied between the plate line and each of the first and second bits are stored in the ferroelectric layer.

In the semiconductor memory device constructed in this way, the channel region of the MIS transistor is affected in a manner varying according to the polarity of the polarized ferroelectric layer by the charges stored in the ferroelectric layer. This results in change in the source-drain-current-gate-voltage characteristic of the MIS transistor. Thus, let "a first gate voltage" represent a gate voltage, at which the source-drain current reaches a predetermined level according to the source-drain-current-gate-voltage characteristic of the MIS transistor, when one kind of binary data "1" and "0"

is written thereto. Further, let "a second gate voltage" represent a gate voltage, at which the source-drain current reaches a predetermined value, when the other kind of binary data "1" and "0" is written thereto. Moreover, let "a data reading gate voltage" represent an electric potential level between the first and second gate voltages. When a reading voltage is applied between the source and the drain of the MIS transistor while the data reading gate voltage is applied to the gate electrode from the word line, it is detected from the first bit line or the second bit line whether or not a source-drain current flows. Consequently, it is decided which kind of the data "1" and "0" is written thereto.

When data is read in this way, the charges stored in the ferroelectric layer merely electrostatically affect the channel region and are not discharged in the semiconductor memory device according to the present invention. Therefore, even when the data written to the memory cells are read, the electric charges having been stored in the ferroelectric layer remain still stored therein. Consequently, the data is not destroyed.

It has been known for some time that ferroelectric materials exhibit internal polarization and that this can be adapted to provide two stable polarization states. Switching between the two states can be used for storage of binary data. Although memory devices have been implemented using this technique there has been the problem that the data read operation is destructive of the data. That is, to distinguish between the two possible polarization states requires the application of a voltage sufficient to switch between the two states. The data is thus lost upon reading. To overcome this problem it is possible to re-write the data after reading but this obviously incurs an undesirable overhead in terms of circuit components, power consumption and speed of operation. These factors undesirably influence overall device size, ease of fabrication and cost. In addition, increases in storage density require a corresponding decrease in read current, which has an adverse effect upon read sensitivity.

A proposal for mitigating the above mentioned disadvantages is to use a thin film transistor structure in which a ferroelectric material is used as the gate insulator. The basic structure of such a device is illustrated in FIG. 12. A layer of ferroelectric material (PZT) is provided over the conventional source (S), channel (C) and drain (D) active layer so as to separate the gate (G) therefrom. That is, the ferroelectric material acts as the gate dielectric. The ferroelectric material causes a shift in threshold voltage of the transistor wherein the shift is dependent upon the state of polarization of the ferroelectric material. In other words, the result is the introduction of a hysterisis in the transfer characteristics of the transistor. The hysterisis in the transfer characteristic can be detected without changing the state of polarization of the ferroelectric material. Non-destructive reading of the stored data can thus be achieved. Moreover, it is found that device sensitivity remains constant with changes in the W/L dimensions of the transistor.

From the foregoing description it will be appreciated that the structure according to FIG. 12 has very significant potential benefits. However, attempts at implementation of the structure in practical memory devices have encountered two key problems. Firstly, difficulties have been encountered in the physical interface between the ferroelectric material and silicon used for the active source/channel/drain layer. Although this problem can be mitigated to some extent by the introduction of buffer layers, such buffer layers are difficult to fabricate and they significantly degrade the performance of the device. Secondly, and more importantly, when the structure is repeated in a matrix to form a large scale memory device it is found to be exceptionally prone to cross-talk, ie the write operation for one cell often affects other cells.

Against this background, in one aspect of the present invention it has been recognised that because the active layer is very thin (typically of the order of 50 Angstroms), charges on the back of the channel affect the threshold voltage of the transistor. The effect is significant, with a shift of ±1 volt in the threshold voltage being caused by a charge of the order of $±1.6×10^{-7}$ coulomb. The said one aspect of the present invention uses this normally undesirable characteristic in order to mitigate the problems in practical implementation of a memory device comprising a thin film structure and ferroelectric data storage.

According to one aspect of the present invention there is provided a semiconductor memory device comprising: an active layer in which are formed a transistor source, channel and drain; a gate for the transistor; a layer of ferroelectric material; and an electrode for applying a voltage to the ferroelectric material; the electrode being spaced apart from the gate, the layer of ferroelectric material having two stable states of internal polarization, and the arrangement being such that the two states of polarization have a detectable difference in effect upon the transfer characteristic of the transistor.

BRIEF DESCRIPTION OF THE DRAWINGS

Embodiments of the present invention will now be described by way of further example only and with reference to the accompanying drawings, in which:

FIGS. 10(A) and 10(B) are a diagram illustrating a manner, in which one kind "1" of binary data is written to the memory cell of the conventional FeRAM, and a diagram illustrating a manner, in which electric charges are stored in the ferroelectric capacitor when the data "1" is written thereto, respectively;

FIGS. 11(A) and 11(B) are a diagram illustrating a manner, in which the other kind "0" of binary data is written to the memory cell of the conventional FeRAM, and a diagram illustrating a manner, in which electric charges are stored in the ferroelectric capacitor when the latter data "0" is written thereto, respectively;

DETAILED DESCRIPTION OF THE PREFERRED EMBODIMENTS

First Embodiment
Overall Configuration

Figure 1:
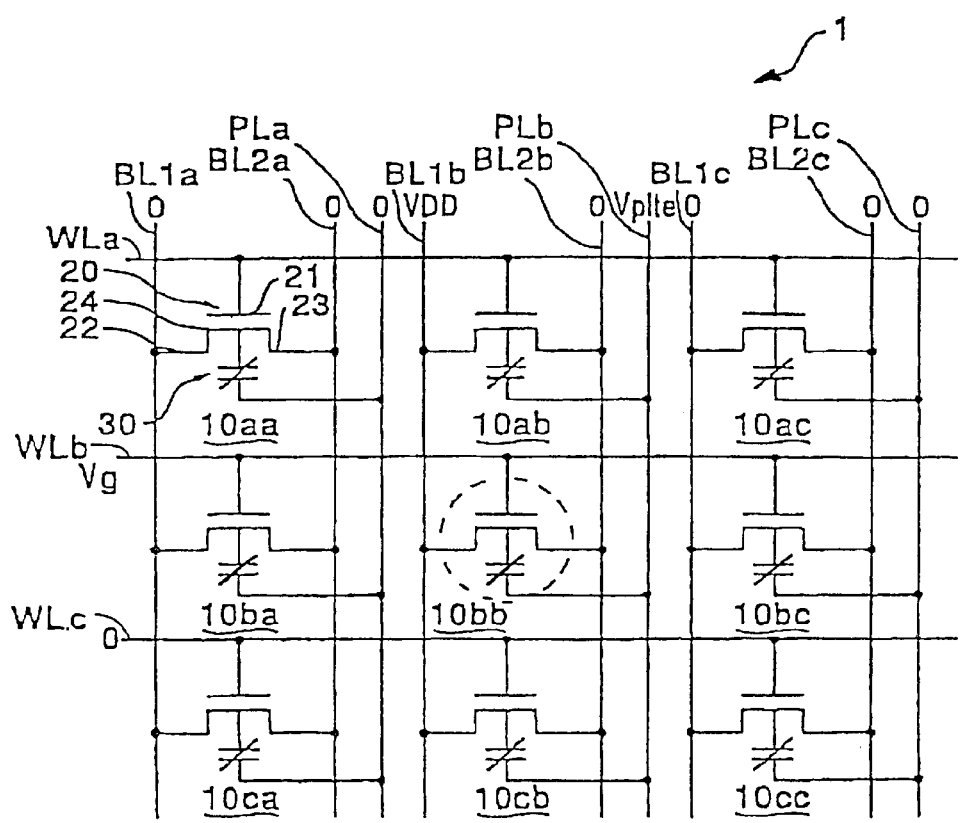
FIG. 1 is a circuit diagram showing an equivalent circuit for illustrating the configuration of each of a plurality of memory cells formed in a matrix-like manner in a semiconductor memory device, which is a first embodiment of the present invention.

FIG. 1 is a circuit diagram showing an equivalent circuit for illustrating the configuration of memory cells formed in a matrix-like manner in a semiconductor memory device, to which the present invention is applied.

As viewed in FIG. 1, in the semiconductor memory device 1 according to this embodiment, a plurality of first bit lines BL1a, BL1b, BL1c, . . . (hereunder referred to as "first bit lines BL1"), a plurality of second bit lines BL2a, BL2b, BL2c, . . . (hereunder referred to as "second bit lines BL2") of the number equal to that of the first bit lines, and a plurality of plate lines PLa, PLb, PL2c, . . .(hereunder referred to as "plate lines PL") extend in the longitudinal direction. Further, as viewed in this figure, a plurality of word lines WLa, WLb, WLc., . . . (hereunder referred to as word lines WL) extend in the transversal direction. These word lines WL intersect with the first bit lines BL1, the second bit lines BL2 and the plate lines PL.

Further, in the semiconductor memory device 1, memory cells 10aa, 10ab, 10ac, . . . , 10ba, 10bb, 10bc, . . . , 10ca, 10cb, 10cc, . . . (hereunder referred to as the memory cells 10) are placed in a matrix-like manner correspondingly to the intersections among these signal lines.

In the case of the semiconductor memory device 1 shown in this figure, one MIS transistor 20, one ferroelectric capacitor 30 are formed in each of the memory cells 10. In the case of this embodiment, an N-channel type thin film transistor is used as the MIS transistor 20.

This embodiment is similar to the conventional FeRAM described with reference to FIGS. 10(A) and 10(B) and FIGS. 11(A) ad 11(B) in that the gate electrodes 21 and the source regions 22 are electrically connected to the word lines WL and the first bit lines BL1, respectively.

Incidentally, in the case of the semiconductor memory device 1 according to this embodiment, the drain region 23 of the MIS transistor 10 is electrically connected to the second bit line BL2 in each of the memory cells 10. Further, the ferroelectric capacitor 30 is provided between the channel region 24 of the MIS transistor 20 and the plate line PL in each of the memory cells 10.

Figure 2:
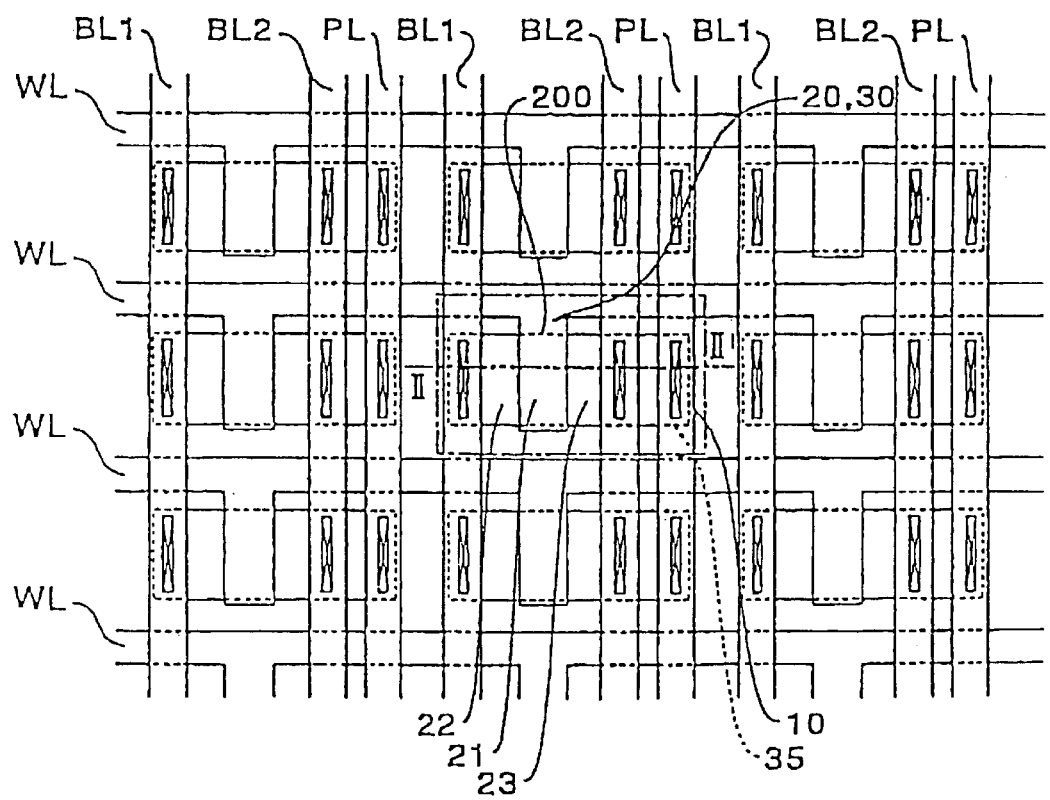
FIG. 2 is a plan diagram showing the configuration of the memory cells formed in the semiconductor memory device illustrated in FIG. 1.
Figure 3:
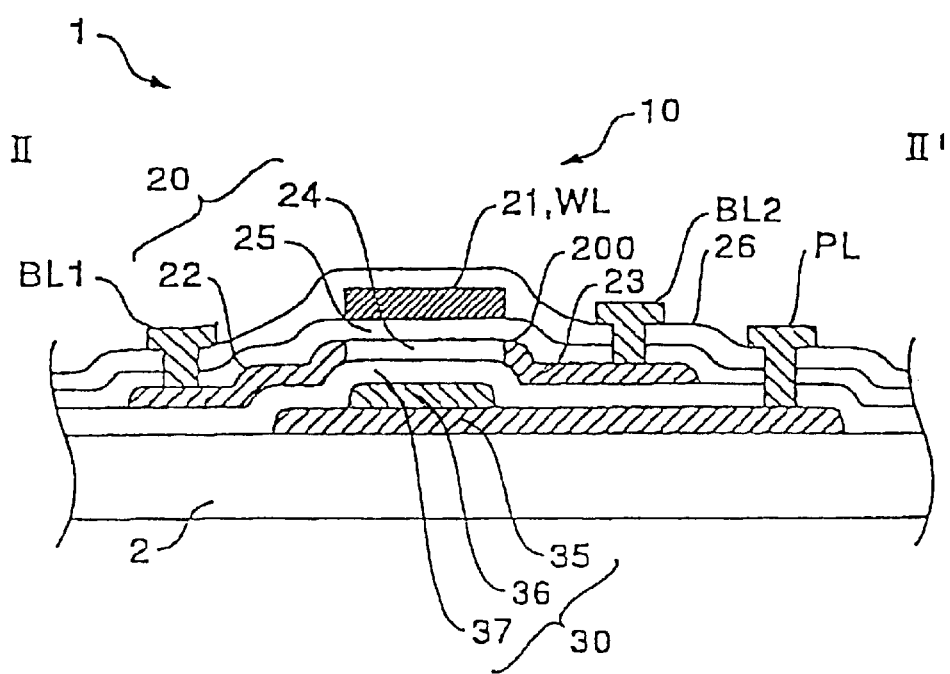
FIG. 3 is a sectional view taken on line II-II' of FIG. 2.

In this embodiment, such a configuration of the memory cell 10 is realized by the structures illustrated in FIGS. 2 and 3.

FIG. 2 is a plan diagram showing the configuration of each of the memory cells. FIG. 3 is a sectional view taken on line II-II' of FIG. 2.

As shown in FIGS. 2 and 3, a plate electrode 35, a ferroelectric layer 36 and an insulating film 37 are stacked in a direction from the bottom layer to the top layer in this order on the top surface of an insulating substrate 2 serving as a base of the semiconductor memory device 1. The ferroelectric capacitor 30 is formed from these layers. Incidentally, the ferroelectric capacitor 30 may employ lead-zirconate-titanate (PZT), barium-strontium-titanate (BST) and strontium-bismuth-niobium-tantalate (Y1 system) as the material of the ferroelectric layer 36. This embodiment employs PZT. Additionally, the ferroelectric capacitor 30 uses the plate electrode 35 as one of two electrodes, and the channel region 24 of the MIS transistor 20 (to be described later) as the other electrode.

A silicon film 200 serving as an active layer of the MIS transistor 20 is formed on the top surface of the insulating film 37 of the ferroelectric capacitor 30. A gate insulating film 25 constituted by a silicon oxide film is formed on the surface of this silicon film 200. Further, a gate electrode 21 constituted by a metallic film or by a doped silicon film is formed on the surface of the gate insulating film 25. In this embodiment, the source region 22 and the drain region 23 are formed on the silicon film 200 in such a way as to self-align with the gate electrode 21. The channel region 24 facing the gate electrode 21 through the gate insulating film 25 is provided between the source region 22 and the drain region 23.

In the case of the example illustrated in this figure, the gate electrode 21 is a part of the word line WL. Moreover, in the case of the example shown in this figure, an inter-layer insulating film 26 is formed on the top surface of the gate electrode 21. The first bit line BL1, the second bit line BL2, and the plate line PL are electrically connected to the source region 22, the drain region 23, and the plate electrode 35 through contact holes penetrating this inter-layer insulating film 26, the gate insulating film 25 or the insulating film 37.

Additionally, the channel region 24 has nearly the same length as the gate electrode 21 in the direction of length of the channel. Also, the ferroelectric layer 36 is of nearly the same length as the gate electrode 21 in the direction of length of the channel.

(Data Write Operation)

Figure 4A:
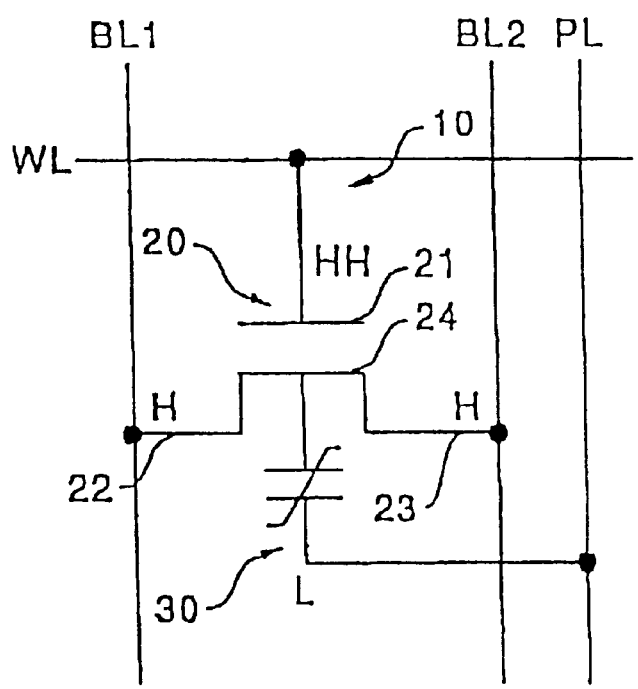
FIGS. 4(A) and 4(B) are a diagram illustrating a manner, in which one kind "1" of binary data is written to the memory cell in the semiconductor memory device shown in FIG. 1, and a diagram illustrating a manner, in which electric charges are stored in the ferroelectric capacitor when the data "1 " is written thereto, respectively.
Figure 4B:
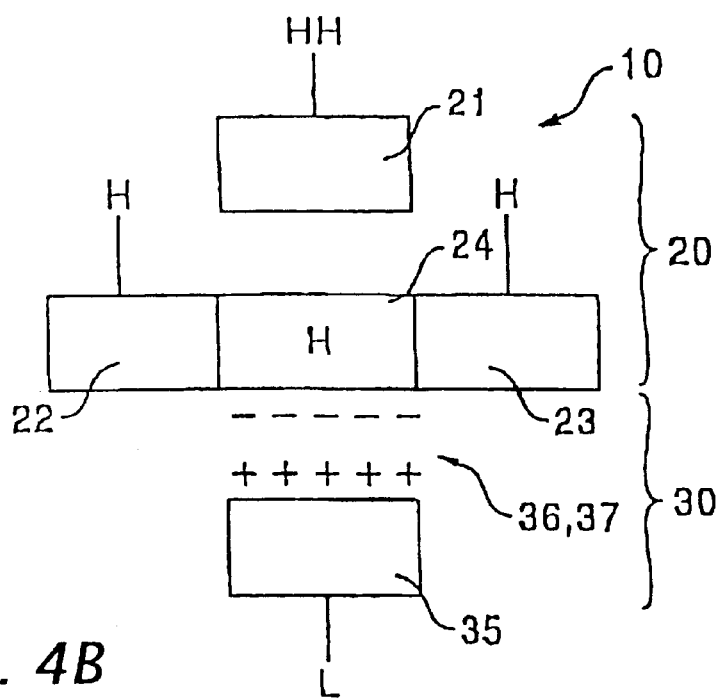
Figure 5A:
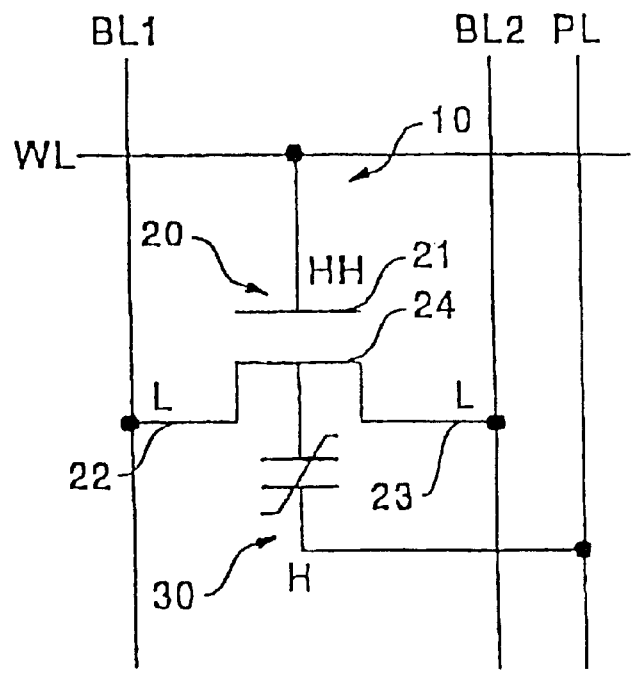
FIGS. 5(A) and 5(B) are a diagram illustrating a manner, in which the other kind "0" of binary data is written to the memory cell in the semiconductor memory device shown in FIG. 1, and a diagram illustrating a manner, in which electric charges are stored in the ferroelectric capacitor when the latter data "0" is written thereto, respectively.
Figure 5B:
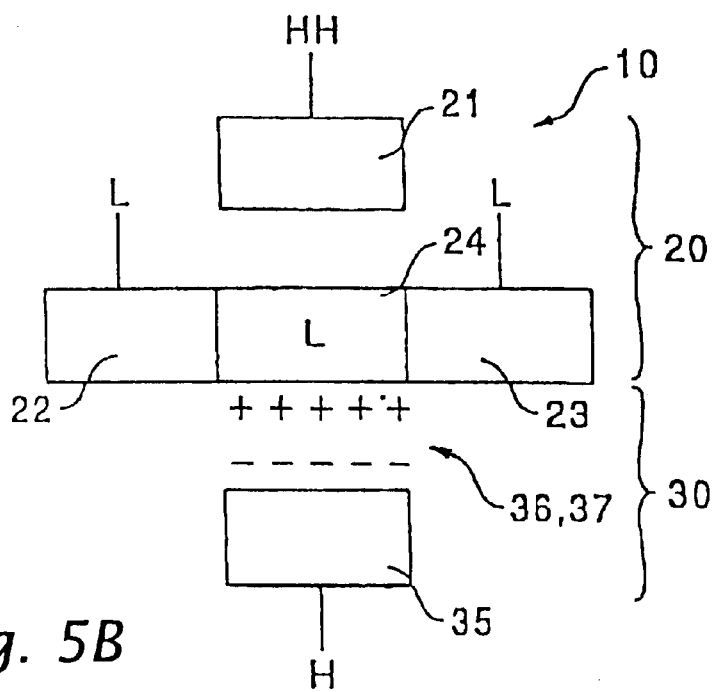

FIGS. 4(A) and 4(B) are a diagram illustrating a manner, in which one kind "1" of binary data is written to this memory cell, and a diagram illustrating a manner, in which electric charges are stored in the ferroelectric capacitor when the data "1" is written thereto, respectively. FIGS. 5(A) and 5(B) are a diagram illustrating a manner, in which the other kind "0" of binary data is written to this memory cell, and a diagram illustrating a manner, in which electric charges are stored in the ferroelectric capacitor when the latter data "0" is written thereto, respectively In the case of this kind of the semiconductor memory device 1, when one of the binary data "1" and "0", for instance, the data "1" is written to the memory cell 10, the first bit line BL1 and the second bit line BL2 are set at the high level (H), while the plate line PL is fixedly set at the low level (L), as shown in FIG. 4(A). In this state, the word line WL is set at a higher level (HH) of a voltage, which is higher than the level (H) of the first bit line BL1 and the second bit line BL2. Consequently, as illustrated in FIG. 4(B), the MIS transistor 20 is turned on, so that the channel region 24 is at the high level of a voltage, which is higher than the level of the plate line PL. Thus, polarization occurs in the ferroelectric capacitor 30, correspondingly to the applied electric field, as illustrated in FIG. 4(B).

In contrast, when the data "0" is written to the memory cell 10, the first bit line BL1 and the second bit line BL2 are set at the low level (L), while the plate line is fixedly set at the high level (H), as shown in FIG. 5(A). In this state, the word line WL is set at a higher level (HH) of a voltage, which is higher than the level (H) of the plate line PL. Consequently, as illustrated in FIG. 5(B), the MIS transistor 20 is turned on, so that the channel region 24 is at an electric potential level, which is lower than the level of the plate line PL. Thus, polarization occurs in the ferroelectric capacitor 30, correspondingly to the applied electric field, as illustrated in FIG. 5(B).

(Data Read Operation)

Figure 6A:
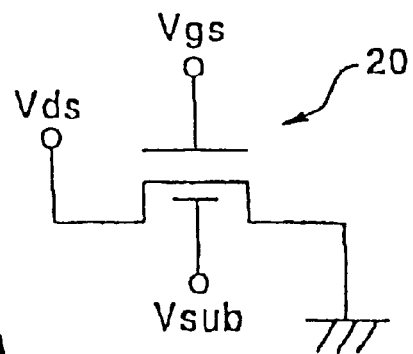
FIGS. 6(A) and 6(B) are a diagram illustrating the principle of reading data written in the memory cells in the semiconductor memory device shown in FIG. 1, and a graph illustrating the relation between the source-drain current and the gate voltage in the MIS transistor, which corroborates this principle.
Figure 6B:
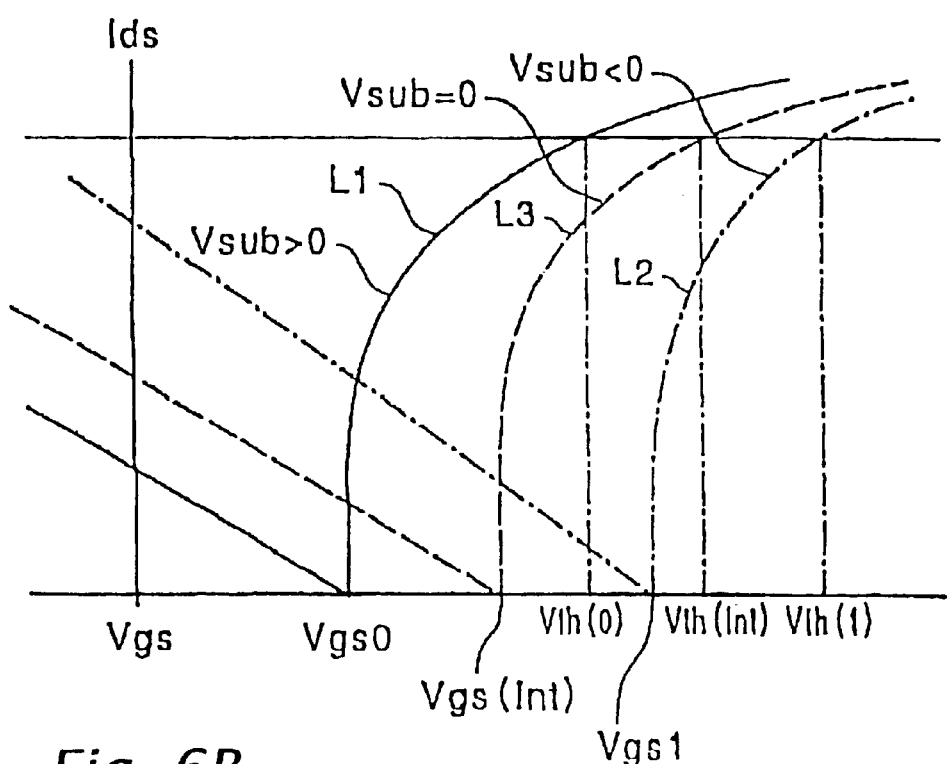

FIGS. 6(A) and 6(B) are a diagram illustrating the principle of reading data written in this memory cell 10, and a graph illustrating the relation between the source-drain current and the gate voltage in the MIS transistor, which corroborates this principle. FIGS. 7(A) and 7(B) are diagrams illustrating the manner of reading data written to this memory cell.

When data is written to the memory cell 10, electric charges corresponding to the polarity of a voltage applied between the plate line PL and each of the first bit line BL1 and the second bit line BL2 are stored in the ferroelectric layer 36.

Effects of the charges, which are stored in the ferroelectric layer 36 of the ferroelectric capacitor 30, on the characteristic of the MIS transistor 20 will be described hereinbelow with reference to FIG. 6.

FIG. 6(B) illustrates the source-drain current characteristic at the time of changing a voltage Vsub to be applied to a counter electrode (namely, a plate electrode 35) placed opposite to the gate electrode 21 with respect to the channel region 24 in the MIS transistor 20 illustrated in FIG. 3. As shown in this graph, the source-drain current characteristic of the MIS transistor 20 vary as indicated by solid lines L1, one-dot chain lines L2, and dotted lines L3, respectively corresponding to the cases that the voltage Vsub has a positive value, a negative value, and zero.

That is, in the case that the voltage Vsub is 0 in the MIS transistor 20, the source-drain current has a minimum value when the gate voltage has a value of Vgs(Int), as indicated by the dotted lines L3. At that time, the source-drain voltage is constant. Further, if the gate voltage is raised from such a value, an "on-current" flows through the MIS transistor 20. Moreover, the source-drain current increases to a certain level with a rise in the gate voltage. Furthermore, when the gate voltage is lowered, an off-leak current (namely, a source-drain current) flows through the MIS transistor 20. Moreover, this source-drain current increases with a rise in the gate voltage. Incidentally, a threshold value is defined herein as a gate voltage at the time when electric current having a certain constant level flows therethrough. The threshold value in this case is denoted by "Vth(Int)".

Such relation between the source-drain current and the gate voltage similarly holds for the cases of positive and negative values of the voltage Vsub. However, the gate voltage, at which the source-drain current has a minimum value, is shifted in a direction, in which the value of this voltage increases or decreases, due to the electrostatic effects of this voltage Vsub on the channel region 24. For instance, in the case that the voltage Vsub has a positive value, the source-drain current has a minimum value when the gate voltage is equal to a value Vgs0, as indicated by solid lines L1. Further, the threshold value (namely, the first gate voltage) changes to a voltage value Vth(0).

In contrast, in the case that the voltage Vsub has a negative value, the source-drain current has a minimum value when the gate voltage is a value Vgs1, as indicated by the one-dot chain lines L2. Moreover, the threshold value (namely, a second threshold gate voltage) changes to a voltage value Vth(1).

Incidentally, when one of the binary data "1" and "0", namely, the data "1" is written to the memory cell 10, the ferroelectric layer 36 is polarized in the semiconductor memory device 1 according to this embodiment, as illustrated in FIG. 4(B). This state corresponds to a state, in which the voltage Vsub has a negative value in the MIS transistor 20. Therefore, the MIS transistor 20 exhibits the source-drain current characteristic indicated by the one-dot chain lines L2 in FIG. 6(B).

In contrast, when the data "0" is written to the memory cell 10, the ferroelectric layer 36 polarizes, as shown in FIG. 5(B). This state corresponds to a state, in which the voltage Vsub has a positive value in the MIS transistor 20. Therefore, the MIS transistor 20 shows the source-drain current characteristic indicated by the solid lines L1 in FIG. 6(B).

Figure 7:
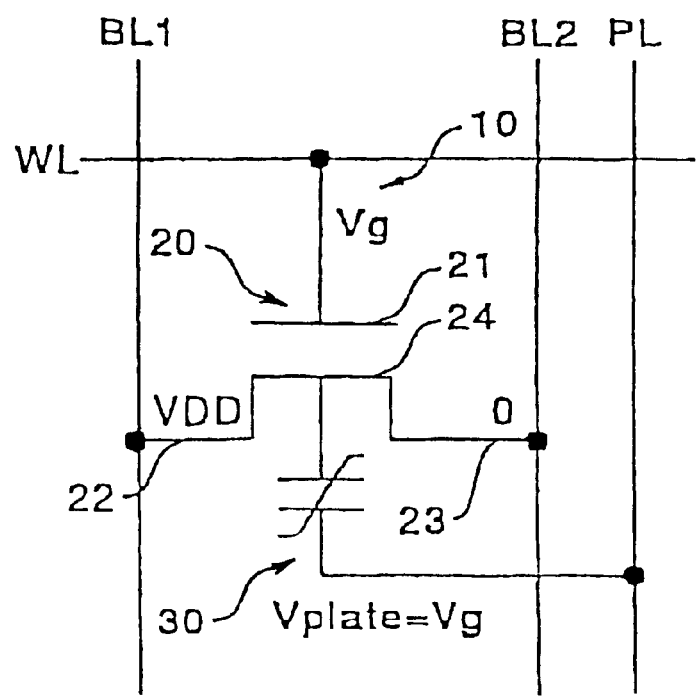
FIG. 7 is a diagram illustrating the manner of reading data written to the memory cells in the semiconductor memory device shown in FIG. 1.

Thus, in the case of the semiconductor memory device 1 according to this embodiment, when data is read from the memory cell 10, an intermediate voltage Vg (namely, a reading gate voltage) between the first voltage Vth(0) and the second voltage Vth(1) is applied from the word line WL to the MIS transistor 20, as illustrated in FIG. 7. Moreover, a voltage, which is nearly equal to this reading gate voltage, is applied to the plate line PL as reading plate potential Vplate.

Further, a reading voltage VDD (which is a positive voltage) is applied to the first bit line BL1, while a ground voltage (namely, zero voltage 0) is applied to the second bit line BL2.

Consequently, when the data "1" is written to the memory cell 10, source-drain current hardly flows through the MIS transistor 20. Conversely, when the data "0" is written to the memory cell 10, a large source-drain current flows therethrough. Therefore, when this source-drain current is detected on the first bit line BL1 or the second bit line BL2, if the level of the source-drain current is not more than a certain level, it is decided that the data "1" is written to the memory cell 10. Conversely, if the level of the source-drain current is not less than the certain level, it is decided that the data "0" is written to the memory cell 10.

Incidentally, in the case that the memory cells 10 are placed in a matrix-like manner, it is necessary for enabling the selective reading of data that the voltage Vth(0) is a positive voltage. That is, the following inequality should be satisfied:

$$0 < Vth(0) < Vg < Vth(1)$$

The threshold value is controlled so that the relation represented by such an inequality holds In this embodiment utilizing such a principle, the reading voltage VDD (which is a positive voltage) is applied to the first bit line BL1 (for example, the first bit line BL1b)

corresponding to the memory cell 10 (for instance, the memory cell 10bb), from which the data should be read. Furthermore, the ground potential (0) is applied to the second bit line BL2 (for example, the second BL2b) corresponding to the memory cell 10, from which data should be read. In such a state, the reading gate voltage Vg and the plate potential Vplate (=the gate voltage Vg) are respectively applied to the word line WL (for instance, the word line WLb) and the plate line PL (for example, the plate line PLb), which correspond to the memory cell 10, from which data should be read. During that, zero voltage 0 is supplied to other signal lines.

Therefore, if a change in current at the time of applying the reading gate voltage Vg on the word line WL corresponding to the memory cell 10, from which data should be read, is detected from the first bit line BL1 and the second bit line BL2 by sensing up, it can be detected which of binary data "1" and "0" is the data stored in the memory cell, which is selected by the word line WL.

(Effects of This Embodiment)

Thus, the semiconductor memory device 1 according to this embodiment determines data written to the memory cell 10 by utilizing the fact that when the channel region 24 of the MIS transistor 20 is electrostatically affected by electric charges stored in the ferroelectric layer 36, the source-drain-current-gate-voltage characteristic of the MIS transistor 20 changes.

Moreover, the electric charges stored in the ferroelectric layer 36 at the time of reading data merely electrostatically affects the channel region 24 and thus are not discharged. Thus, even when data written to the memory cell 10 is read, the charges stored in the ferroelectric layer 36 remain stored in the ferroelectric capacitor 30.

(Manufacturing Method)

The semiconductor memory device 1 constructed in this manner can be manufactured by combining well known semiconductor processes, especially, low temperature polysilicon TFT (Thin-Film Transistor) processes. Therefore, a method of manufacturing this semiconductor memory device 1 will be described hereunder by referring to FIGS. 2 and 3.

First, a clean insulating substrate 2 is prepared.

Subsequently, a conductive film constituted by a metallic film or by a doped silicon film is formed on the surface of the insulating substrate 2. Thereafter, the patterning of this conductive film is performed by using photolithography techniques. Thus, a plate electrode 35 is formed.

Next, a thin film made of a ferroelectric material is formed on approximately the entire surface of the substrate 2 by a film forming method, such as a CVD method, a sol-gel method using a metal alkoxide solution, and a sputtering method. Then, the patterning of this thin film is performed by using the photolithography techniques, so that a ferroelectric layer 36 is formed.

Subsequently, an insulating film 37 constituted by a silicon oxide film is formed on nearly the entire substrate 2 by various kinds of film forming methods, such as a plasma CVD method.

Next, a silicon film is formed on the insulating substrate 2 by various kinds of film forming methods, such as the plasma CVD method. Thereafter, the patterning of the silicon film is performed by utilizing the photolithography techniques, so that an island-like silicon film 200 is formed. Incidentally, a material obtained by forming an amorphous silicon film in a low temperature process and then crystallizing the amorphous silicon film by a laser anneal method may be used to form the silicon film.

Subsequently, a gate insulating film 25 constituted by a silicon oxide film is formed on nearly the entire surface of the insulating substrate 2 by various kinds of film forming methods, such as the plasma CVD method.

Then, a conductive film constituted by a metallic film or by a doped silicon film is formed on the top surface of the gate insulating film 25. Thereafter, the patterning of this conductive film is performed by using the photolithography techniques, so that the gate electrode 21 is formed.

Next, N-type impurities are introduced into the silicon film 200 by using the gate electrode 21 as a mask. Consequently, the source region 22 and the drain region 23 are formed on the silicon film 200 in such a way as to self-align with the gate electrode 21.

Subsequently, the inter-layer insulating film 26 constituted by a silicon oxide film is formed on nearly the entire surface of the insulating substrate 2 by various kinds of film forming methods, such as the plasma CVD method. Thereafter, contact holes are formed in this inter-layer insulating film 26.

Next, a conductive film, for example, a metallic film, such as an aluminum film, or a doped silicon film is formed. Subsequently, the patterning of this conductive film is performed by using the photolithography techniques, so that the first bit line BL1, the second bit line BL2, and the word line WL are formed.

Second Embodiment

Figure 8:
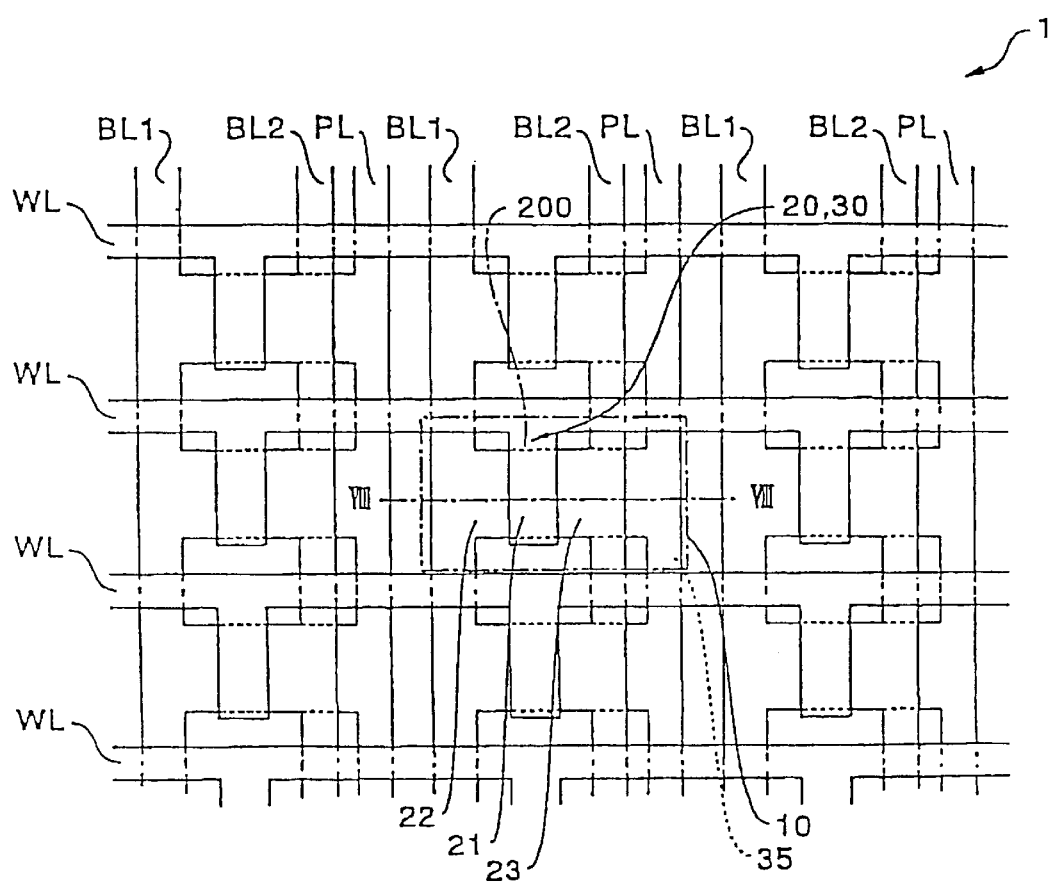
FIG. 8 is a plan diagram showing the configuration of the memory cells formed in a semiconductor memory device, which is a second embodiment of the present invention.
Figure 9:
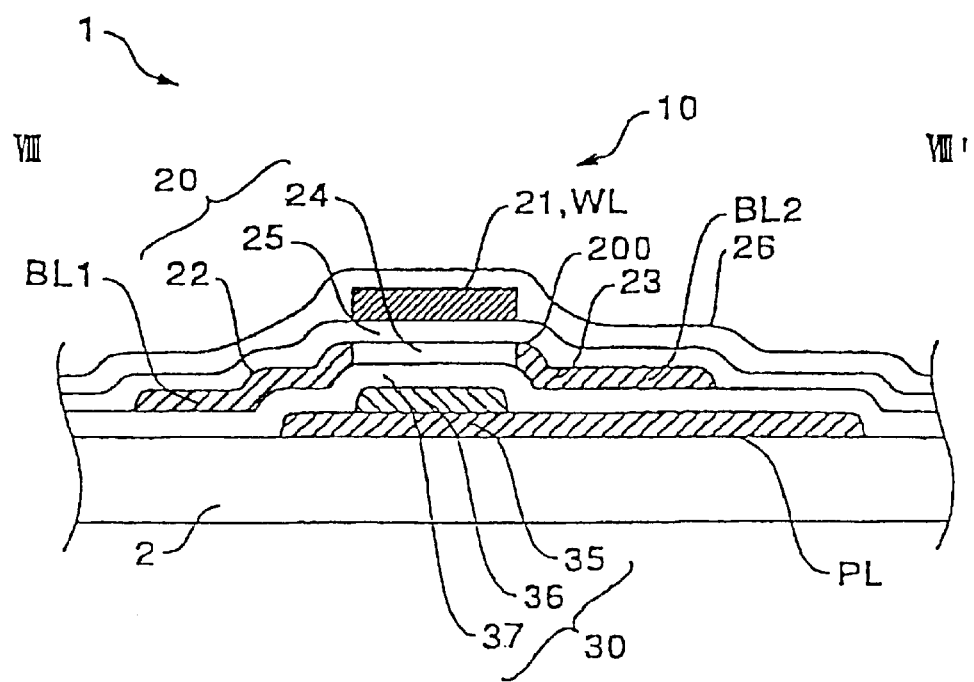
FIG. 9 is a sectional view taken on line VIII-VIII' of FIG. 8.

FIG. 8 is a plan diagram showing the configuration of the memory cells formed in another semiconductor memory device, which is a second embodiment of the present invention. FIG. 9 is a sectional view taken on line VIII-VIII' of FIG. 8. Incidentally, the basic structure of the semiconductor memory device according to this embodiment is similar to that of the semiconductor memory device according to the first embodiment, which has been described by referring to FIGS. 2 and 3. Thus, in FIGS. 8 and 9, like characters designate common constituent components of the first embodiment. Therefore, the description of such components is omitted herein. Further, data write and read operations of the semiconductor memory device 1 according to the second embodiment are similar to those of the semiconductor memory device according to the first embodiment. Thus, the description of these operations of the second embodiment is omitted herein.

In the case of the semiconductor memory device 1 described by referring to FIGS. 2 and 3, the first bit lines BL1 and the second bit lines BL2 are formed by using conductive films formed on the surface of the inter-layer insulating film 26. In contrast, in the case of the semiconductor memory device 1 illustrated in FIGS. 8 and 9, wiring parts obtained by directly extending the conductive film of the plate electrode 35 in each of the memory cells 10 are used as the plate lines PL. Further, in each of the memory cells 10, wiring parts obtained by being extended from both end portions of a region, which is formed as the active layer, in the silicon film 200 constituting the active layer of the MIS transistor 20 are used as the first bit line BL1 and the second bit line BL2. That is, each of the first bit lines BL1 is a conductive region that is integral with the source region 22 of the MIS transistor 20, while each of the second bit lines BL2 is a conductive region that is integral with the drain region 23 of the MIS transistor 20. Incidentally, each of the word lines WL is integral with the gate electrode 21 of the MIS transistor 20, similarly as in the case of the first embodiment.

In the case of forming the semiconductor memory device in this way, when the source region 22 and the drain region 23 are formed, the first bit lines BL1 and the second bit lines BL2 can be simultaneously formed. Further, when the plate electrode 35 is formed, the plate line PL can be formed. Therefore, the second embodiment has an advantage in that the number of processes in the case of manufacturing the semiconductor memory apparatus 1 is small.

Other Embodiments

In any of the aforementioned embodiments, the top gate type TFT is formed, as the MIS transistor 20 to be formed in the memory cell 10. However, the bottom gate of TFT may be used. Further, an N-channel type thin film transistor is formed as the MIS transistor 20. Alternatively, a P-channel type thin film transistor may be used as the MIS transistors 20.

Figure 12:
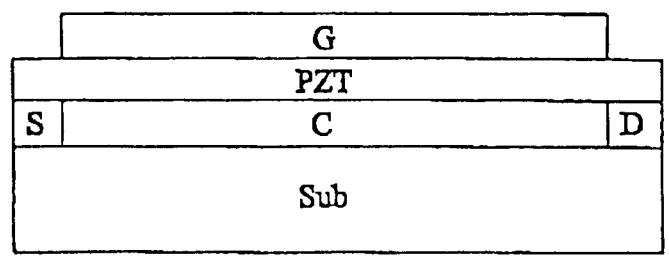
FIG. 12 illustrates the structure of a memory device in which a ferroelectric material is disposed between the active layer of a transistor and the gate of the transistor.
Figure 13:
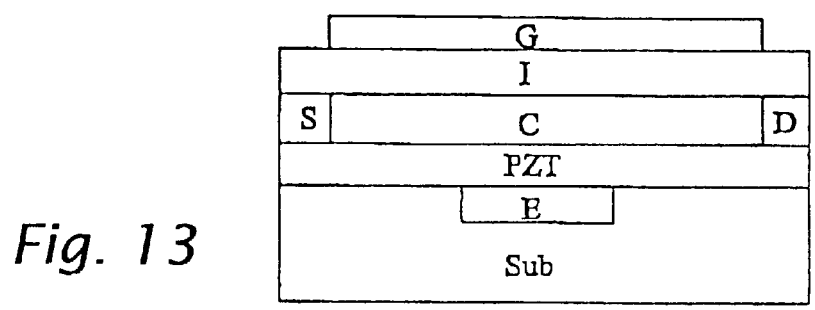
FIG. 13 illustrates the structure of a memory device according to one embodiment of the present invention.

The structure of another embodiment of the present invention is illustrated in FIG. 13. The structure comprises a conventional thin film arrangement of a source(S)/channel (C)/drain(D) active layer having a gate (G) separated therefrom by an insulating layer (I). Instead, however, of this arrangement being formed directly on a substrate (Sub), it is formed on a layer of ferroelectric material (PZT). The ferroelectric material (PZT) is supported by the device substrate (Sub). Within the substrate and below the ferroelectric material is an electrode (E). This electrode (E) is used to apply a voltage to the ferroelectric material so as to switch the internal polarization of the ferroelectric material between the two stable states. That is, the electrode (E) is used for writing data into the memory. As with the arrangement of FIG. 12, the transfer characteristics of the transistor exhibit an easily measured hysterisis which is dependent upon the state of the internal polarization of the ferroelectric material. Data stored in the device can thus be read nondestructively.

In contrast to the arrangement illustrated in FIG. 12, the structure of FIG. 13 has the ferroelectric material (PZT) on the opposite side of the active layer (S, C, D) to the gate (G) of the transistor. Furthermore, whereas the gate is provided for control of the transistor (in the conventional manner), a separate electrode (E) is provided for switching between the two polarization states of the ferroelectric material. Nonetheless, the polarization of the ferroelectric material still affects the transfer characteristics of the transistor so that the state of polarization can easily and non-destructively be determined.

As illustrated in FIG. 13, the size of the electrode (E) for switching the ferroelectric material is significantly smaller than the size of the gate (G). The size of the gate (G) is determined by the need to ensure proper control of the active layer (S, C, D). In contrast, there is little restriction on the minimum size of the electrode (E) for switching the ferroelectric material. Thus, by arranging for the size of the electrode (E) for switching the ferroelectric material to be significantly smaller than the size of the gate (G), it is possible to ensure that it is the regions respectively adjacent the source (S) and the drain (D) which control switching of the ferroelectric material. Essentially, the storage effect of the ferroelectric material is equivalent to data storage on a capacitor with one plate of the capacitor being provided by the electrode (E) and the other plate being provided by the combined effect of the respective regions adjacent the source (S) and the drain (D). The equivalent circuit diagram of the structure illustrated in FIG. 13 is thus the circuit shown in FIG. 14.

Figure 14:
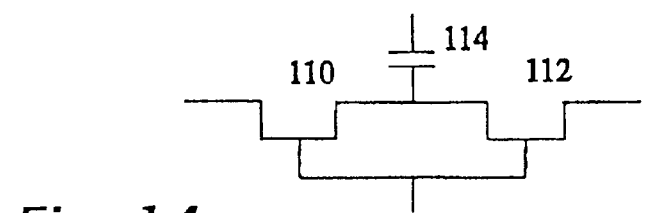
FIG. 14 is an equivalent circuit diagram for the structure illustrated in FIG. 13.

As indicated by the equivalent circuit of FIG. 14, the embodiment illustrated in FIG. 13 can be considered equivalent to two series connected transistors (110, 112) with one plate of a data storage capacitor (114) connected to the point of serial connection between the transistors (110, 112). By arranging a switch in line with the capacitor (114) it is possible to eliminate the interference problem which has previously hindered practical implementation of a large scale data storage matrix using ferroelectric data storage cells.

Figure 15:
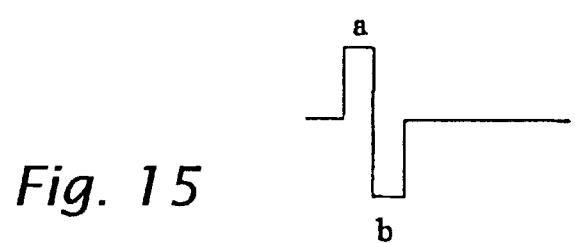
FIG. 15 shows the waveform of a signal applied in the embodiment of FIG. 13.

FIG. 15 shows the waveform of a signal applied to the electrode (E) for the ferroelectric material. A first pulse is applied in period (a) and an equal and opposite pulse is applied in period (b). The desired data write operation is carried out at the currently addressed storage cell during period (a). However, adjacent cells in the matrix see an overall zero change due to the balancing of the pulse in period (a) by the pulse in period (b). Elimination of the cross-talk problem enables practical implementation of a large scale memory matrix.

Compared with the structure of FIG. 12, the structure of FIG. 13 has significant benefits in terms of the practical fabrication process. Specifically, the structure of FIG. 13 can be fabricated by first forming a thin film transistor according to conventional techniques. These techniques involve high temperature processes and, in particular, laser annealing of the active silicon layer. It is these high temperature processes which cause the interface problems between the silicon and the ferroelectric material in the structure according to FIG. 12. In the structure according to FIG. 13, the ferroelectric material can be, for example, spin coated onto the device after the fabrication of the conventional thin film transistor structure. There is no requirement for self-alignment of the electrode (E) in the same way that there is such a requirement for self-alignment of the gate (G) with the channel (C) in the transistor structure. The interface problem can therefore also be avoided, or at least mitigated, using the structure according to the present invention and without the use of performance degrading buffer layers.

The embodiment of the invention described above is applicable to thin film arrangements, or generally to arrangements in which the presence of the ferroelectric material affects the transfer characteristic of the transistor. However, another embodiment of the present invention is based on recognition of the value of the equivalent circuit shown in FIG. 14 and general application thereof to, for example, single crystal transistor devices which are not necessarily thin film. FIG. 16(d) illustrates a structural embodiment of the equivalent circuit of FIG. 14, which embodiment can be applied to single crystal transistor devices which are not necessarily thin film in structure. FIGS. 16(a) to (d) illustrate fabrication steps for formation of a memory device according to this embodiment of the present invention.

Figure 16A:
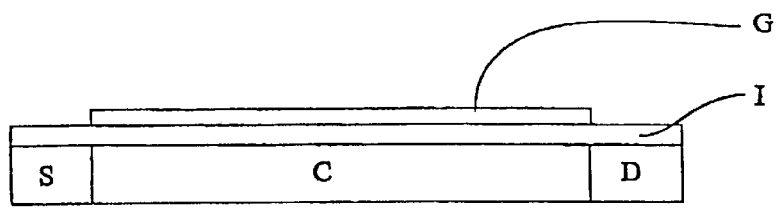
FIGS. 16(a) to 16(d) illustrate fabrication steps in preparing a second embodiment of the present invention.
Figure 16B:
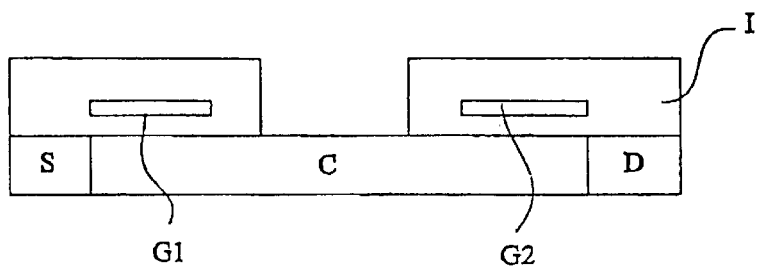
Figure 16C:
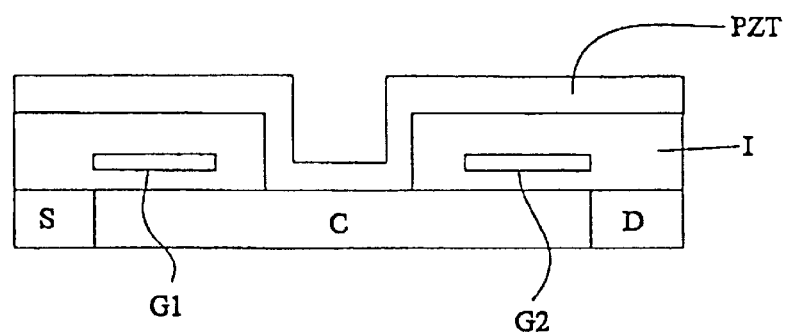
Figure 16D:
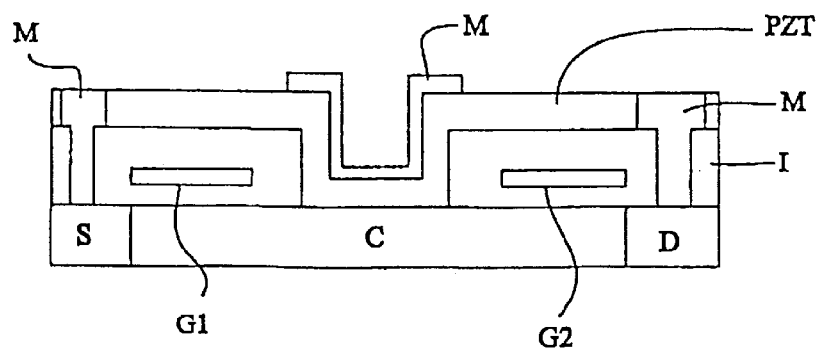

FIG. 16(a) illustrates a stage part-way through the fabrication of a conventional transistor structure. Source (S), channel (C) and drain (D) have been fabricated in an active layer; an insulating oxide layer (I) has been formed over the active layer; and a gate (G) has been formed on the oxide layer, in self alignment with the channel. Moving beyond the conventional fabrication steps, and as shown in FIG. 16(b), the central portion of the upper side of the structure is etched so as to split the gate and to remove the oxide under the gap thus formed in the gate. Further, the oxide is grown around the two newly separated partial gate electrodes (G1, G2). Next a layer of ferroelectric material (PZT) is deposited over the whole of the surface of the structure shown in FIG. 16(b) so as to result in the structure shown in FIG. 16(c). Subsequently, metal electrodes (M) are formed as shown in FIG. 16(d)—one each contacting the source and the drain and one formed in the gap between the two partial gates (G1, G2).

Figure 17:
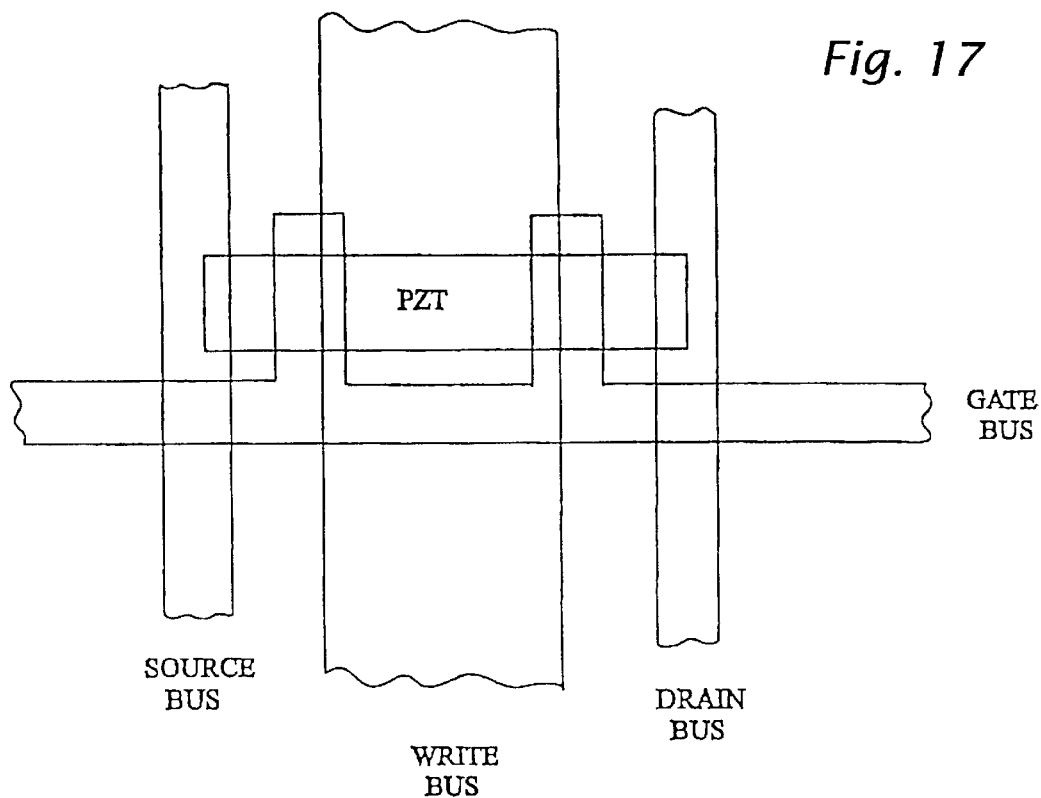
FIG. 17 shows a general plan view layout of a memory device using the structure illustrated in FIG. 16(d)

The general plan view layout of a memory device using the cell structure illustrated in FIG. 16(d) is shown in FIG. 17. With the same equivalent circuit (FIG. 14) as the embodiment of FIG. 13, obviously the embodiment of FIGS. 16 and 17 exhibits the same advantage of avoiding the problem of inter-cell, and particularly inter-row, interference when performing write operations in a matrix semiconductor memory.

Figure 18:
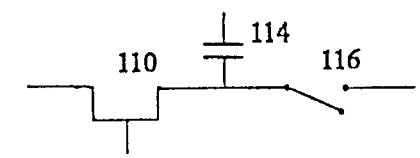
FIG. 18 illustrates an equivalent circuit for a variation of the second embodiment of the present invention.

As another aspect of the present invention, it has been recognised that it is possible to implement the memory cell using a variation in which the two switching transistors of FIG. 14 are reduced to a single switching transistor. The equivalent circuit of this variation is shown in FIG. 18. Specifically, and in equivalent circuit terms, the circuit of FIG. 18 is the same as that of FIG. 14 except that one of the transistors (say, transistor 112) is replaced by a simple switch (116). In practice this means that the drain of the remaining switching transistor (110) is allowed to float.

The structural embodiment of the circuit of FIG. 18 can be derived from other embodiments of the present invention by: considering the length of the partial gates (in FIG. 13, the regions adjacent the source and drain respectively) as L1 and L3, with the length of the ferroelectric contact (E) as L2; and then allowing L3 to tend to zero. In practice this means that it is not necessary to form a gate G and then split it as in FIGS. 16(a) and 16(b), so that the fabrication process illustrated in FIG. 16 is thus simplified.

The aforegoing description has been given by way of example only and it will be appreciated by a person skilled in the art that modifications can be made without departing from the scope of the present invention.

What is claimed is:

1. A semiconductor memory device comprising:
a plurality of memory cells each formed by stacking a plate electrode, a ferroelectric layer, an insulating film, a channel region of a MIS transistor, a gate insulating film of said MIS transistor, and a gate electrode of said MIS transistor in said order,
wherein a word line is electrically connected to said gate electrode of each of the plurality of memory cells, wherein first and second bit lines are electrically connected to a source region and a drain region of said MIS transistor, respectively, and wherein a plate line is electrically connected to said plate electrode.

2. The semiconductor memory device according to claim 1, wherein said MIS transistor is a thin film transistor.

3. The semiconductor memory device according to claim 1, wherein an active layer of said thin film transistor is a low temperature polysilicon film.

4. The semiconductor memory device according to claim 1, wherein when data is stored in said memory cell, a voltage of a polarity corresponding to the data is applied between said plate line and each of said first and second bit lines, and wherein a gate voltage for turning on said MIS transistor is applied to said gate electrode from said word line.

5. The semiconductor memory device according to claim 1, wherein when one kind of binary data is stored in said memory cell, a voltage of a polarity corresponding to the one kind of binary data is applied between said plate line and each of said first and second bit lines, and a gate voltage for turning on said MIS transistor is applied to said gate electrode from said word line,
wherein when the other kind of binary data is stored in said memory cell, a voltage of a polarity opposite to the polarity of the voltage applied in a case of storing the one kind of data is applied between said plate line and each of said first and second bit lines, and wherein a gate voltage for turning on said MIS transistor is applied to said gate electrode from said word line.

6. The semiconductor memory device according to claim 4, wherein when data is read from said memory cell, electric potential between a first gate voltage and a second gate voltage is applied as a reading gate voltage to said gate electrode from said word line, the first gate voltage being a gate voltage, at which a source-drain current reaches a predetermined level according to a source-drain-current-gate-voltage characteristic of said MIS transistor, when one kind of binary data written thereto, the second gate voltage being a gate voltage, at which the source-drain current reaches a predetermined value according to the source-drain-current-gate-voltage characteristic of said MIS transistor, when the other kind of binary data is written thereto, and wherein a source-drain current is detected from said first bit line or said second bit line when a reading voltage is applied between said source and said drain of said MIS transistor while a voltage being nearly equal to the reading gate voltage is applied to said gate electrode from said word line.

7. A semiconductor memory device comprising:
an active layer in which are formed a transistor source, channel and drain;
a gate for the transistor;
a layer of ferroelectric material; and
an electrode for applying a voltage to the ferroelectric material;
the electrode being spaced apart from the gate, the layer of ferroelectric material having two stable states of internal polarization, wherein the two states of polarization have a detectable difference in effect upon the transfer characteristic of the transistor;
wherein the gate and the layer of ferroelectric material are provided on opposite sides of the active layer.

8. A semiconductor memory device comprising:
an active layer in which are formed a transistor source, channel and drain;
a gate for the transistor;
a layer of ferroelectric material; and
an electrode for applying a voltage to the ferroelectric material;
the electrode being spaced apart from the gate, the layer of ferroelectric material having two stable states of internal polarization, wherein the two states of polarization have a detectable difference in effect upon the transfer characteristic of the transistor;
wherein the gate and the layer of ferroelectric material are provided on the same side of the active layer as each other.

9. A semiconductor memory device comprising:
an active layer in which are formed a transistor source, channel and drain;
a gate for the transistor;
a layer of ferroelectric material; and
an electrode for applying a voltage to the ferroelectric material;
the electrode being spaced apart from the gate, the layer of ferroelectric material having two stable states of internal polarization, wherein the two states of polarization have a detectable difference in effect upon the transfer characteristic of the transistor;
wherein the length of the electrode for the ferroelectric material is shorter than the length of the gate.

10. A semiconductor memory device as claimed in claim 8, wherein the gate is split into two partial gates and the layer of ferroelectric material extends therebetween.

11. A semiconductor memory device as claimed in claim 8, wherein a first insulating layer is formed on the active layer, the gate is formed on the first insulating layer, a second insulating layer is formed on the gate, and the layer of ferroelectric material is formed on the second insulating layer.

12. A semiconductor memory device comprising a matrix of memory cells each cell being in the form of a device comprising:

an active layer in which are formed a transistor source, channel and drain;

a gate for the transistor;

a layer of ferroelectric material; and an electrode for applying a voltage to the ferroelectric material;

the electrode being spaced apart from the gate, the layer of ferroelectric material having two stable states of internal polarization, wherein the two states of polarization have a detectable difference in effect upon the transfer characteristic of the transistor.

13. A method of manufacturing a semiconductor memory device including:

an active layer in which are formed a transistor source, channel and drain;

a gate for the transistor;

a layer of ferroelectric material; and an electrode for applying a voltage to the ferroelectric material;

the electrode being spaced apart from the gate, the layer of ferroelectric material having two stable states of internal polarization, wherein the two states of polarization have a detectable difference in effect upon the transfer characteristic of the transistor;

the method comprising the steps of forming the transistor and subsequently applying the layer of ferroelectric material.

14. The method of claim 13, further comprising the step of prior to applying the layer of ferroelectric material splitting the gate so that the ferroelectric layer can be applied between the two partial gates thus formed.

* * * * *

UNITED STATES PATENT AND TRADEMARK OFFICE
CERTIFICATE OF CORRECTION

PATENT NO.   : 6,580,633 B2
DATED        : June 17, 2003
INVENTOR(S)  : Inoue et al.

It is certified that error appears in the above-identified patent and that said Letters Patent is hereby corrected as shown below:

<u>Title page,</u>
Item [75], Inventors, Inventors' residences should be -- Satoshi Inoue, Chino (JP); Ichio Yudasaka, Chino-chi (JP); Piero Migliorato, New Buckenham (GB) --;
Item [30], insert -- [30] Foreign Application Priority Data,
Sep 28, 2000 (UK) 0023791.7
Sep 28, 2000 (UK) 0023792.5 --;
Item [56], References Cited, U.S. PATENT DOCUMENTS, add: -- 6,222,756 B1 * 4/2001 Lee...365/145; 6,045,734 * 4/2000 Aozasa et al.... 264/103; 5,723,885 * 3/1998 Ooishi...257/295; 5,446,688 * 8/1995 Torimaru 365/145 --;
FOREIGN PATENT DOCUMENTS, add: -- 11-214642 8/1999 Japan; 09-097851 4/1997 Japan; 06-196647 7/1994 Japan; 08-335645 12/1996 Japan --;

<u>Column 4,</u>
Line 2, "ie" should be -- i.e., --;

<u>Column 5,</u>
Line 63, "ad" should be -- and --;

<u>Column 8,</u>
Line 64, insert a period after "holds".

Signed and Sealed this

Twenty-fifth Day of November, 2003

JAMES E. ROGAN
*Director of the United States Patent and Trademark Office*